US009538661B2

(12) United States Patent
Yamamoto et al.

(10) Patent No.: US 9,538,661 B2
(45) Date of Patent: Jan. 3, 2017

(54) ELECTRONIC DEVICE MODULE INCLUDING A PRINTED CIRCUIT

(71) Applicant: KABUSHIKI KAISHA TOSHIBA, Tokyo (JP)

(72) Inventors: Nobuhiro Yamamoto, Yokohama Kanagawa (JP); Keiko Kaji, Kawasaki Kanagawa (JP); Kota Tokuda, Kawasaki Kanagawa (JP); Takahisa Funayama, Musashino Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/837,856

(22) Filed: Aug. 27, 2015

(65) Prior Publication Data

US 2016/0157350 A1    Jun. 2, 2016

(30) Foreign Application Priority Data

Dec. 1, 2014  (JP) .................................. 2014-243190

(51) Int. Cl.
*G11B 5/48* (2006.01)
*H05K 1/18* (2006.01)
*H05K 1/11* (2006.01)
*H05K 1/02* (2006.01)

(52) U.S. Cl.
CPC ............. *H05K 1/181* (2013.01); *G11B 5/4826* (2013.01); *H05K 1/028* (2013.01); *H05K 1/11* (2013.01)

(58) Field of Classification Search
CPC ............ G11B 17/00; G11B 17/02; G11B 5/48

USPC ......... 360/99.24, 99.16, 99.13, 99.17, 99.18, 360/97.12, 97.01, 97.02
See application file for complete search history.

(56) References Cited

U.S. PATENT DOCUMENTS

| | | | |
|---|---|---|---|
| 8,867,225 B2 * | 10/2014 | Sato ....................... | H05K 1/184 361/748 |
| 2013/0182401 A1 * | 7/2013 | Furutani .............. | H05K 1/0296 361/782 |
| 2013/0194764 A1 * | 8/2013 | Mikado .................. | H05K 1/185 361/761 |
| 2013/0284506 A1 * | 10/2013 | Zanma ................... | H05K 1/115 174/260 |

FOREIGN PATENT DOCUMENTS

JP           2012-054329 A          3/2012

* cited by examiner

*Primary Examiner* — Allen T Cao
(74) *Attorney, Agent, or Firm* — Patterson & Sheridan, LLP

(57) ABSTRACT

An electronic device module includes a wiring board having a first surface including first and second electrodes formed thereon and a second surface opposite to the first surface, a supporting member attached to the second surface of the wiring board, a first electronic unit mounted on the first surface of the wiring board and electrically connected to the first electrode, and a second electronic unit mounted on the first surface of the wiring board and electrically connected to the second electrode. The wiring board includes a wiring extending from the first electronic unit to a position closer to the second electronic unit, and a reinforcement layer disposed between the first and second electronic units and apart from the wiring in a thickness direction of the wiring board.

20 Claims, 7 Drawing Sheets

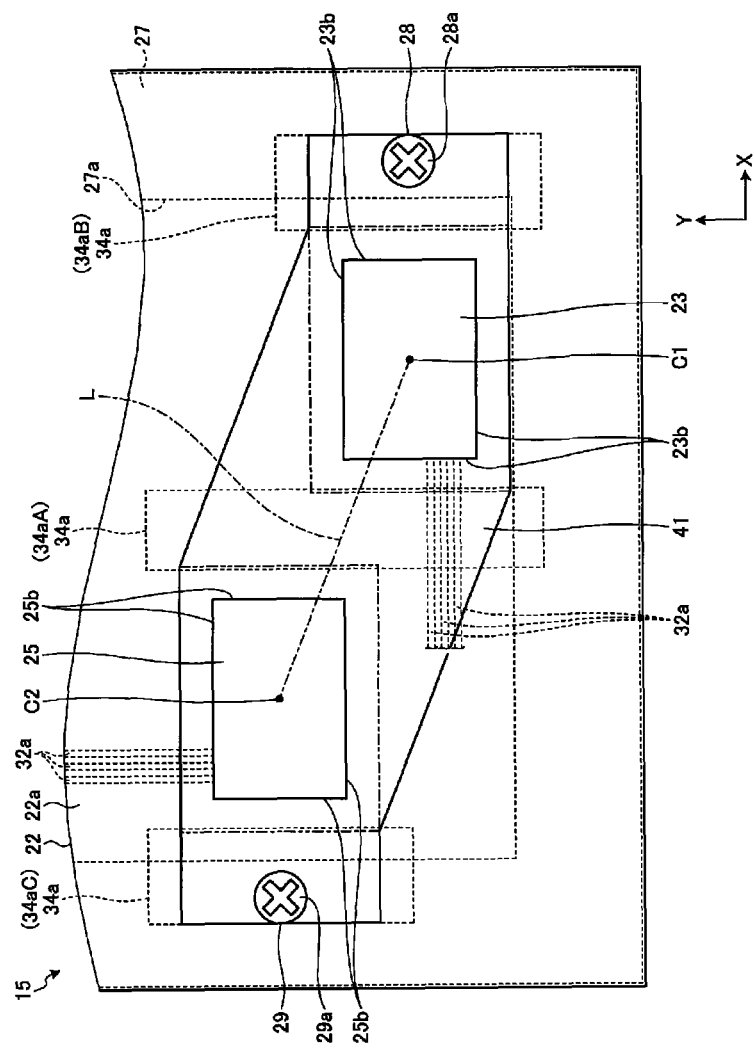

ELECTRONIC DEVICE MODULE INCLUDING A PRINTED CIRCUIT

CROSS-REFERENCE TO RELATED APPLICATION

This application is based upon and claims the benefit of priority from Japanese Patent Application No. 2014-243190, filed Dec. 1, 2014, the entire contents of which are incorporated herein by reference.

FIELD

Embodiments described herein relate generally to an electronic device module including a printed circuit.

BACKGROUND

Various electronic apparatuses include a base member, such as a printed wiring board or a flexible printed wiring board (film), on which an electronic unit is mounted. The base member is then attached to a housing or to other members of the electronic apparatuses.

DESCRIPTION OF THE DRAWINGS

FIG. 7 is a plan view of a portion of an FPC assembly as an example of the electronic module according to a third embodiment.

DETAILED DESCRIPTION

One or more embodiments provide an electronic device module that securely protects a wiring that tends to be subject to stress concentration.

In general, according to an embodiment, an electronic device module includes a wiring board having a first surface including first and second electrodes formed thereon and a second surface opposite to the first surface, a supporting member attached to the second surface of the wiring board, a first electronic unit mounted on the first surface of the wiring board and electrically connected to the first electrode, and a second electronic unit mounted on the first surface of the wiring board and electrically connected to the second electrode. The wiring board includes a wiring extending from the first electronic unit to a position closer to the second electronic unit, and a reinforcement layer disposed between the first and second electronic units and apart from the wiring in a thickness direction of the wiring board.

First Embodiment

Hereinafter, a first embodiment will be described with reference to FIG. 1 to FIG. 4. With regard to elements according to an embodiment or description of the elements, multiple expressions may be used. With respect to the configuration elements and description thereof, other expression that is not used in the description may be used. Furthermore, with respect to the configuration elements and description thereof for which a plurality of expressions is not used, other expressions may be used.

Figure 1:
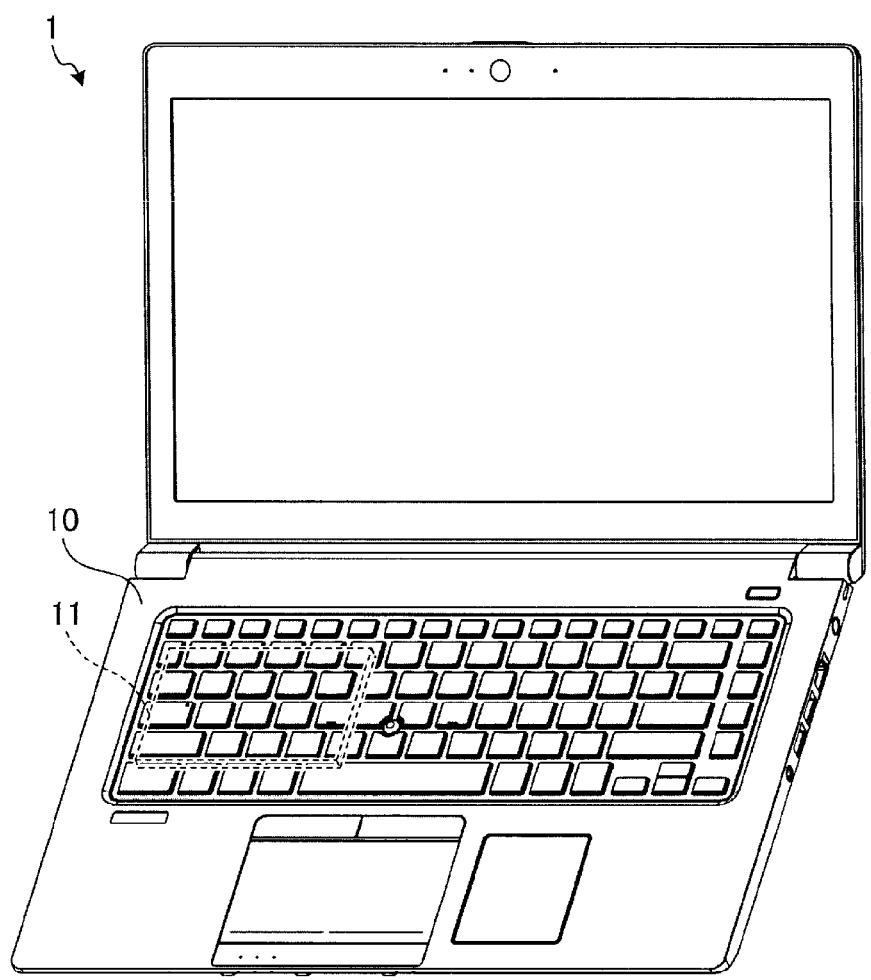
FIG. 1 is a perspective view of an electronic apparatus including an electronic device module according to a first embodiment.

FIG. 1 is a perspective view illustrating an electronic apparatus 1 according to a first embodiment. The electronic apparatus 1 is, for example, a portable computer. The electronic apparatus 1 is not limited to this, and may be other electronic apparatus, such as a tablet, a smart phone, a mobile phone, a personal digital assistant (PDA), a television receiver, and a display. As illustrated in FIG. 1, the electronic apparatus 1 includes a housing 10 and a hard disc drive (HDD) 11. The HDD 11 may also be referred to as, for example, a device, a component, and a portion. The HDD 11 is mounted in the housing 10, and is depicted by a dashed line in FIG. 1.

Figure 2:
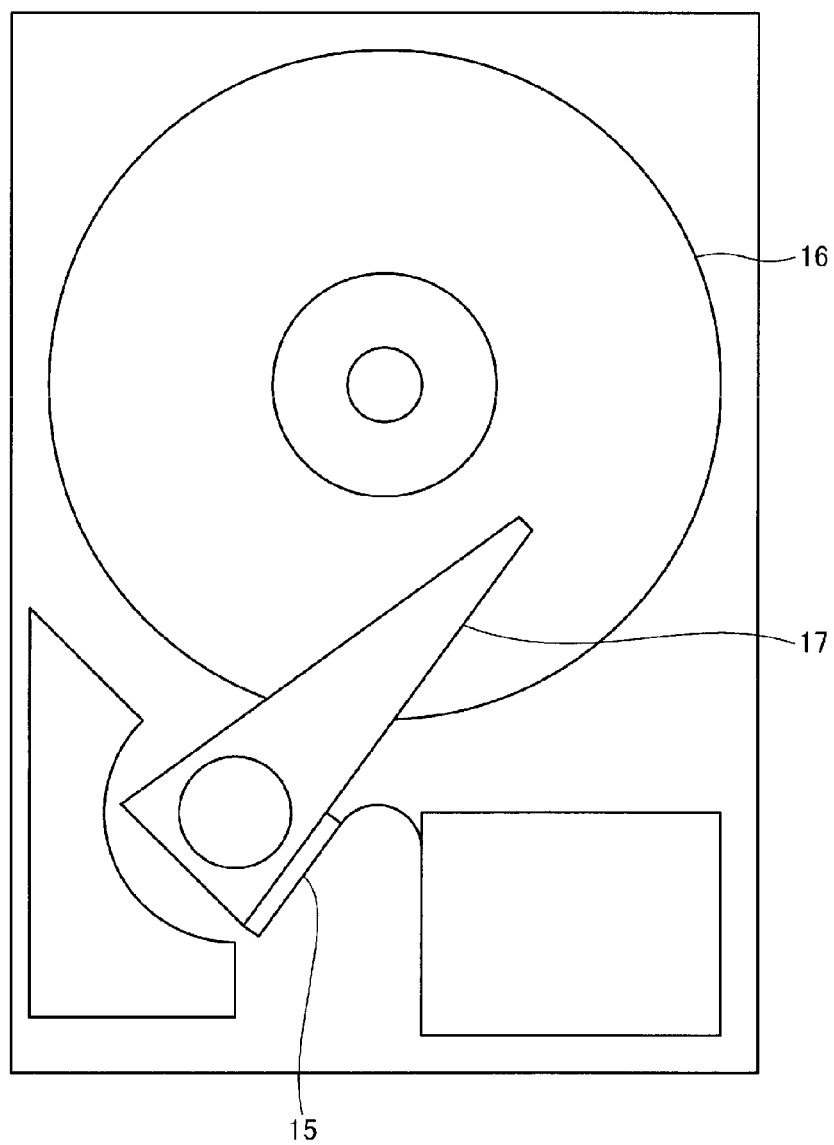
FIG. 2 is a plan view of an HDD including the electronic module according to the first embodiment.

FIG. 2 is a plan view of the HDD 11 according to the first embodiment. As illustrated in FIG. 2, the HDD 11 includes various components, such as a flexible printed circuit board assembly (hereinafter, referred to as FPC assembly) 15, a disc 16, a head 17, and a printed circuit board (PCB).

The FPC assembly 15 is attached to a carriage of the head 17, for example, and connects the head 17 and the PCB. The head 17 may swing in order to read recorded data from and write data to the disc 16. The FPC assembly 15 may be bent according to a swing of the head 17.

Figure 3:
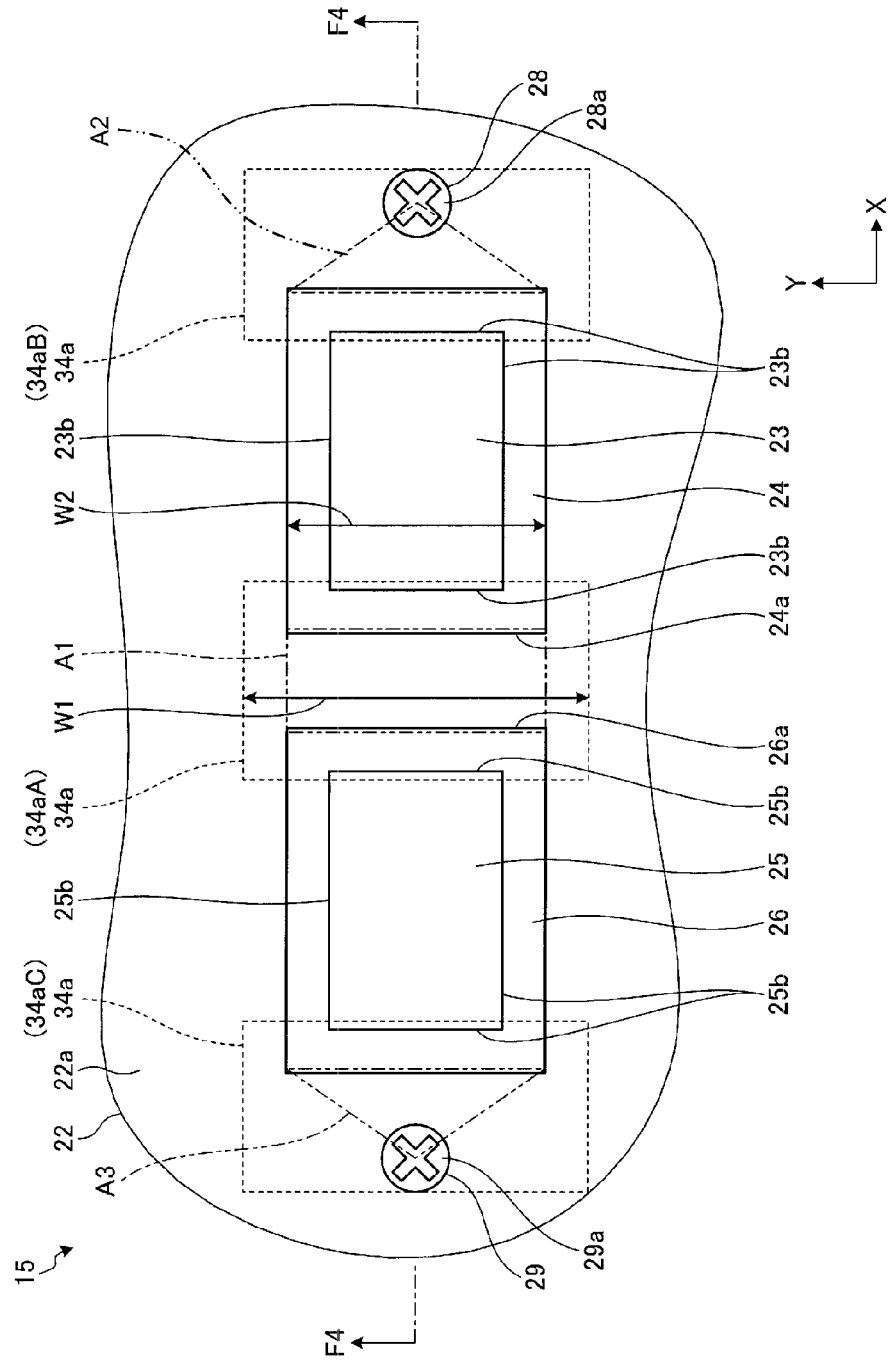
FIG. 3 is a plan view of a portion of an FPC assembly as an example of the electronic module according to the first embodiment.
Figure 4:
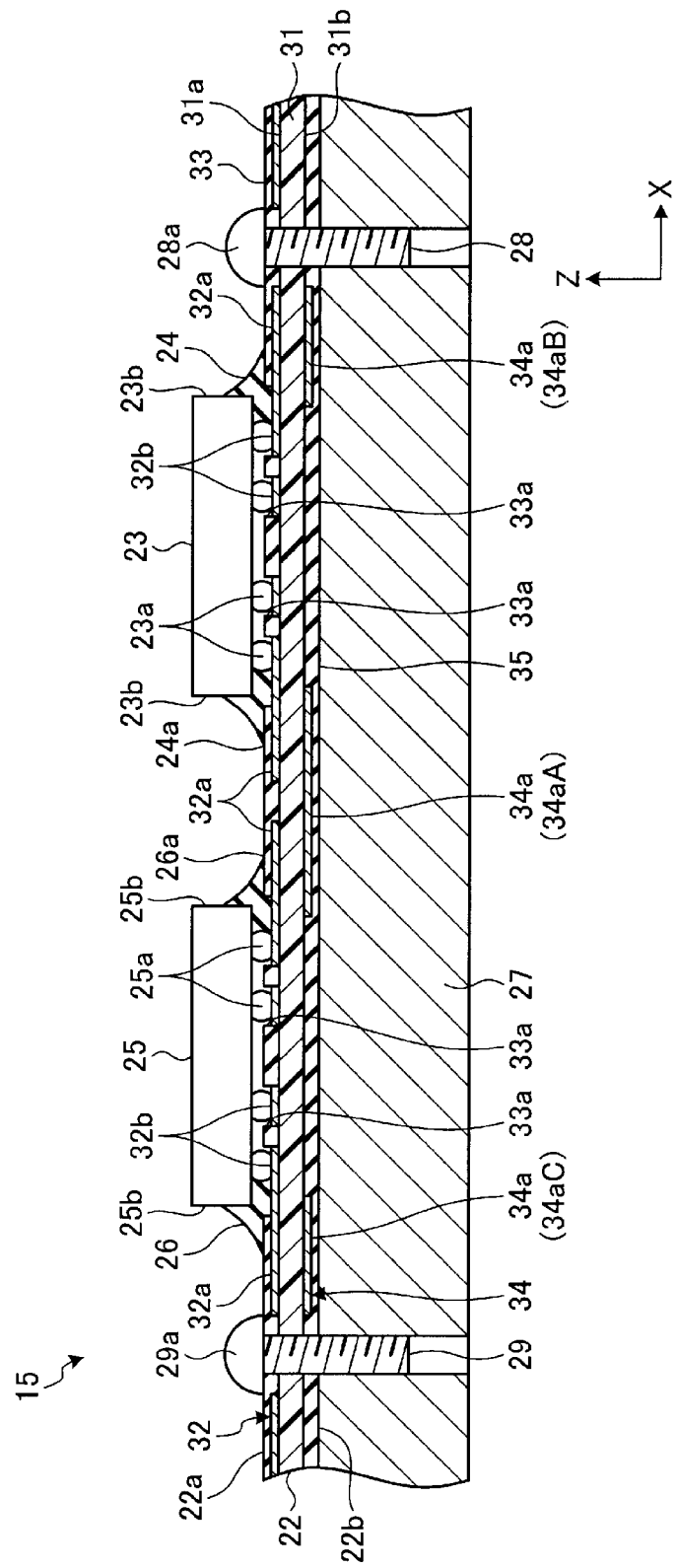
FIG. 4 is a cross-sectional view of the FPC assembly taken along a line F4-F4 in FIG. 3.

FIG. 3 is a plan view of a portion of the FPC assembly according to the first embodiment. FIG. 4 is a cross-sectional view of the FPC assembly 15 according to the first embodiment, taken along a line F4-F4 in FIG. 3. FIG. 3 and FIG. 4 illustrate a portion of the FPC assembly 15 attached to the head 17.

As illustrated in each of FIG. 3 and FIG. 4, an X axis, a Y axis, and a Z axis are defined in the present disclosure. The X axis, the Y axis, and the Z axis are orthogonal to each other. The X axis extends along a width direction of the FPC assembly 15. The Y axis extends along a length direction of the FPC assembly 15. The Z axis extends along a thickness direction of the FPC assembly 15.

As illustrated in FIG. 4, the FPC assembly 15 includes a flexible printed wiring board (FPC) 22, a first IC 23, a first underfill 24, a second IC 25, a second underfill 26, a support plate 27, a first screw 28, and a second screw 29.

In the present embodiment, the FPC 22 is an example of a flexible printed wiring board and a substrate, and may be referred to as a base section and a component. The first IC 23 and the first underfill 24 are examples of a first electric component and a first component. The first IC 23 is an example of an electronic component. The first underfill 24 is an example of a cover portion. The second IC 25 and the second underfill 26 are examples of a second electric component and a second component. The configuration elements described here is an example, and, for example, the first IC 23 and the first underfill 24, the second IC 25 and the second underfill 26, and the first screw 28 and the second screw 29 may be the first and second components, respectively. The support plate 27 is an example of a second reinforcement portion, and may also be referred to as, for example, a support portion, an attachment portion, a member, and a portion.

The FPC 22 is a substrate with flexibility. The substrate is not limited to FPC 22, and may be another substrate such as a printed wiring board with rigidity. The FPC 22 has a first surface 22a and a second surface 22b. The first surface 22a is an example of a first plane. The second surface 22b is an example of a second plane. The second surface 22b is opposite to the first surface 22a. The first and second surfaces 22a and 22b are substantially flat, but are bent when the FPC 22 is bent.

The FPC 22 includes a base member 31, a first conductive layer 32, a first cover layer 33, a second conductive layer 34, and a second cover layer 35. The base member 31 is an example of an insulating layer, and may also be referred to as a base portion, a base body, a layer, a member, and a portion. The first conductive layer 32 is an example of a conductive layer. The first and second conductive layers 32 and 34 may also be referred to as a conductive portion, a metal portion, and a portion. The first and second cover layers 33 and 35 may also be referred to as an insulating portion, a protection portion, and a portion.

The base member 31 is formed of an insulating material, such as polyester or polyimide, and is a member of a film shape with flexibility. The base member 31 is not limited to this. The base member 31 has a first plane 31a and a second plane 31b. The second plane 31b is opposite to the first plane 31a.

The first conductive layer 32 is formed from a conductor such as copper, and provided on the first plane 31a of the base member 31. The first conductive layer 32 includes a plurality of wirings 32a and a plurality of pads 32b. The wirings 32a may also be referred to as a pattern, a signal line, an extending portion, and a portion. The pad 32b may also be referred to as a land, an electrode, an end portion, an attachment portion, a connection portion, and a portion.

The wirings 32a form a portion of a circuit provided in the FPC 22. The wirings 32a have, for example, a portion extending in a direction along the X axis, and a portion extending in a direction along the Y axis. The direction along the X axis is an example of a first direction. The wirings 32a may have a portion extending in a direction different from the direction along the X axis and the direction along the Y axis. The pad 32b is provided on an end portion of the wirings 32a.

For example, the first cover layer 33 is formed from a synthetic resin, and has an insulation property. The first cover layer 33 covers the first conductive layer 32. That is, the first conductive layer 32 is positioned between the base member 31 and the first cover layer 33. The first cover layer 33 forms the first surface 22a of the FPC 22. The first surface 22a of the FPC 22 may be formed from other members.

The first cover layer 33 covers the wirings 32a to protect the wirings 32. Furthermore, the first cover layer 33 has a plurality of openings 33a. The pads 32b are exposed through the opening 33a of the first cover layer 33.

The second conductive layer 34 is formed of a conductor such as copper, and on the second plane 31b of the base member 31. The second conductive layer 34 has a plurality of ground layers 34a. The ground layer 34a is an example of a ranging portion, a first reinforcement portion, and a conductor, and may also be referred to as a solid ground, a pattern, a foil, a film, and a portion.

The ground layer 34a is a conductive layer connected to a ground potential, and for example, is electrically connected to a circuit including the wirings 32a. The ground layer 34a is formed of, for example, copper, and thus has a higher rigidity than the base member 31, the first cover layer 33, and the second cover layer 35.

The second cover layer 35 is formed of, for example, a synthetic resin, and has an insulation property. The second cover layer 35 covers the second conductive layer 34. That is, the second conductive layer 34 is positioned between the base member 31 and the second cover layer 35. The second cover layer 35 forms the second surface 22b of the FPC 22. The second surface 22b of the FPC 22 may be formed of other members. The second cover layer 35 covers the ground layer 34a to protect the ground layer 34a.

The first and second ICs 23 and 25 are semiconductor packages having amplification circuit (amplifiers), for example. The first and second ICs 23 and 25 are not limited to this, and may be other components.

The first and second ICs 23 and 25 include a plurality of terminals 23a and 25a, respectively. The plurality of terminals 23a and 25a is electrically connected to corresponding pads 32b that are exposed through the openings 33a, through, for example, soldering. That is, the first and second ICs 23 and 25 are attached to the first surface 22a of the FPC 22, and mounted on the FPC 22.

The first and second ICs 23 and 25 have a substantially rectangular parallelepiped shape and have four side edges 23b and 25b, respectively. As illustrated in FIG. 3, the side edges 23b and 25b respectively face the direction along the X axis or the direction along the Y axis. Shapes and orientations of the first and second ICs 23 and 25 are not limited to these.

The first IC 23 is disposed apart from the second IC 25, in the direction along the X axis. One side edge 23b of the first IC 23 faces one side edge 25b of the second IC 25. Positional relationship of the first and second ICs 23 and 25 is not limited to this relationship.

The first underfill 24 is formed of, for example, a synthetic resin, and is attached to the first IC 23, and the first surface 22a of the FPC 22. In other words, the first underfill 24 partially covers the first IC 23 and the FPC 22. Accordingly, the first underfill 24 fixes the first IC 23 in the FPC 22.

As illustrated in FIG. 4, the first underfill 24 is disposed between the first IC 23 and the FPC 22, and is attached to the side edge 23b of the first IC 23 so as to form a fillet. As illustrated in FIG. 3, in a plan view of the first surface 22a of the FPC 22, the first underfill 24 surrounds the first IC 23.

The second underfill 26 is formed of, for example, a synthetic resin, and is attached to the second IC 25, and the first surface 22a of the FPC 22. In other words, the second underfill 26 partially covers the second IC 25 and the FPC 22. Accordingly, the second underfill 26 fixes the second IC 25 to the FPC 22.

As illustrated in FIG. 4, the second underfill 26 is disposed between the second IC 25 and the FPC 22, and is attached to the side edge 25b of the second IC 25 so as to form a fillet. As illustrated in FIG. 3, in a plan view of the first surface 22a of the FPC 22, the second underfill 26 surrounds the second IC 25.

The first and second underfills 24 and 26 have outer edges 24a and 26a, respectively. As illustrated in FIG. 3, in a plan view of the first surface 22a of the FPC 22, the outer edges 24a and 26a are outer end portions of the first and second underfills 24 and 26. In other words, the outer edges 24a and 26a are boundaries between portion in which the first and second underfills 24 and 26 are formed, and a portion in which the first surface 22a of the FPC 22 is exposed. The outer edge 24a of the first underfill 24 is separated from the outer edge 26a of the second underfill 26.

As illustrated in FIG. 4, the support plate 27 is attached to the second surface 22b of the FPC 22. Accordingly, the support plate 27 covers at least a portion of the second surface 22b. The support plate 27 is formed of, for example, an aluminum alloy. For this reason, the support plate 27 has rigidity and thermal conductivity that are higher than those of the FPC 22. For this reason, the support plate 27 can be used for improvement of rigidity and heat dissipation of the FPC assembly 15. Furthermore, the support plate 27 has a thermal expansion rate higher than that of the FPC 22. The support plate 27 may not be formed of the aluminum alloy, and may be formed of other material such as a synthetic resin.

The support plate 27 overlaps the first and second ICs 23 and 25, and the first and second underfills 24 and 26, in the direction along the X axis.

The support plate 27 overlaps at least a portion of the ground layer 34a of the second conductive layer 34 in the direction along the X axis. The support plate 27 is separated from the ground layer 34a, in the direction along the Z axis. The support plate 27 is disposed farther from the first and second ICs 23 and 25, and the first and second underfills 24 and 26 than the second conductive layer 34 is.

The first and second screws 28 and 29 respectively fix the FPC 22 to the support plate 27. The first and second screws 28 and 29 have screw heads 28a and 29a, respectively. The screw heads 28a and 29a are in contact with the first surface 22a of the FPC 22, and fix the FPC 22 to the support plate 27. That is, the first and second screws 28 and 29 are attached to the FPC 22.

As illustrated in FIG. 3, the first screw 28 is positioned apart from the second screw 29, in the direction along the X axis. The first and second ICs 23 and 25 are positioned between the first screw 28 and the second screw 29. The first and second ICs 23 and 25 and the first and second screws 28 and 29 are disposed in the direction along the X axis.

The first IC 23 is positioned between the first screw 28 and the second IC 25. The second IC 25 is positioned between the second screw 29 and the first IC 23. The outer edge 24a of the first underfill 24 is separated from the first screw 28, and the outer edge 26a of the second underfill 26 is separated from the second screw 29.

In the above-described FPC assembly 15, at least a portion of the wirings 32a of the first conductive layer 32 extends in the direction along the X axis, as illustrated in FIG. 4. In other words, at least a portion of the wirings 32a extends towards the second IC 25 from the first IC 23. The direction along the X axis is a direction towards the first IC 23 from the first screw 28, or is a direction towards the second IC 25 from the second screw 29.

As depicted by a dashed line in FIG. 3, the second conductive layer 34 according to the present embodiment includes three ground layers 34a. Hereinafter, each ground layer 34a may be individually referred to as a ground layer 34aA, a ground layer 34aB, and a ground layer 34aC.

As illustrated in FIG. 3, in a plan view of the first surface 22a of the FPC 22, one ground layer 34aA is provided at least in an area A1 ranging from the first underfill 24 to the second underfill 26, in the FPC 22. In other words, the ground layer 34aA is provided at least in the area A1 ranging from a portion to which the first IC 23 and the first underfill 24 are attached, to a region in which the second IC 25 and the second underfill 26 are attached, in the FPC 22. That is, the ground layer 34aA is provided in an area wider than the area A1 in the direction along the X axis. FIG. 3 illustrates the area A1 using a two-dot chain line.

The area A1 is a portion, which is positioned between the outer edges 24a and 26a of the first and second underfills 24 and 26, in the FPC 22. For the purpose of explanation, in FIG. 3, the two-dot chain lines of the area A1 are slightly different from the outer edges 24a and 26a.

The ground layer 34aA according to the present embodiment is provided in an area including an area ranging from the first IC 23 to the second IC 25, in the FPC 22. That is, the ground layer 34aA overlaps a portion of the first underfill 24 and a portion of the second underfill 26. In other words, the ground layer 34aA is provided over a region in which the outer edges 24a and 26a of the first and second underfills 24 and 26 are included, in the direction along the X axis.

A width W1 of the ground layer 34aA is wider than a width W2 of the first underfill 24. In a plan view of the first surface 22a, the widths W1 and W2 are lengths of the ground layer 34aA and the first underfill 24, respectively, in a direction (direction along Y axis) orthogonal to a direction (direction along the X axis) towards the second IC 25 from the first IC 23.

As described above, the ground layer 34aA is provided across a region in which the first IC 23 and the first underfill 24 are attached, a region in which the second IC 25 and the second underfill 26 are attached, and a region that is positioned between the first and second underfills 24 and 26, in the FPC 22.

In the area A1 ranging from the first underfill 24 to the second underfill 26 in the FPC 22, at least a portion of the wirings 32a extends along the direction along the X axis. The wirings 32a provided in the area A1 overlaps the support plate 27, in the direction along the X axis. The ground layer 34aA overlaps the wirings 32a provided in the area A1 in the direction along the X axis. The shape of the wirings 32a in the area A1 is not limited to the above mentioned shape.

In a plan view of the first surface 22a of the FPC 22, one ground layer 34aB is provided at least in an area A2 ranging from the first underfill 24 to the first screw 28, in the FPC 22. In other words, the ground layer 34aB is provided at least in the area A2 ranging from a region to which the first IC 23 and the first underfill 24 are in contact, to a region at which the first screw 28 is positioned, in the FPC 22. That is, the ground layer 34aB is provided in an area wider than the area A2 in the direction along the X axis. FIG. 3 illustrates the area A2 using a two-dot chain line.

The area A2 is a substantially triangular portion, which is positioned between the outer edge 24a of the first underfill 24 and the first screw 28, in the FPC 22. For the purpose of explanation, in FIG. 3, the two-dot chain line of the area A2 is slightly different from the outer edge 24a.

The ground layer 34aB according to the present embodiment is provided in a substantially rectangular area including an area ranging from the first IC 23 to the first screw 28, in the FPC 22. That is, the ground layer 34aB overlaps a portion of the first underfill 24. In other words, the ground layer 34aB is provided over a position corresponding to the outer edge 24a of the first underfill 24, in the direction along the X axis.

A width of the ground layer 34aB is equal to the width W1 of the ground layer 34aA. For this reason, the width of the ground layer 34aB is wider than the width W2 of the first underfill 24. The width of the ground layer 34aB is not limited to this.

As described above, the ground layer 34aB is provided over a region in which the first IC 23 and the first underfill 24 are in contact, a region in which the first screw 28 is located, and a region between the first underfill 24 and the first screw 28, in the FPC 22.

In the area A2 ranging from the first underfill 24 to the first screw 28 in the FPC 22, at least a portion of the wirings 32a extends along the direction along the X axis. The wirings 32a provided in the area A2 overlaps the support plate 27, in the direction along the X axis. The ground layer 34aB overlaps the wirings 32a provided in the area A2 in the direction along the X axis. The shape of the wirings 32a in the area A2 is not limited to the above-described shape.

In a plan view of the first surface 22a of the FPC 22, one ground layer 34aC is provided at least in an area A3 ranging from the second underfill 26 to the second screw 29, in the FPC 22. In other words, the ground layer 34aC is provided at least in the area A3 ranging from a region to which the second IC 25 and the second underfill 26 are in contact, to a region at which the second screw 29 is located, in the FPC 22. That is, the ground layer 34aC is provided in an area wider than the area A3 in the direction along the X axis. FIG. 3 illustrates the area A3 using a two-dot chain line.

The area A3 is a substantially triangular portion which is positioned between the outer edge 26a of the second underfill 26 and the second screw 29, in the FPC 22. For the purpose of explanation, in FIG. 3, the two-dot chain line of the area A3 is different from the outer edge 26a.

The ground layer 34aC according to the present embodiment is provided in a substantially rectangular area including an area ranging from the second IC 25 to the second screw 29, in the FPC 22. That is, the ground layer 34aC overlaps a portion of the second underfill 26. In other words, the ground layer 34aC is provided over a position corresponding to the outer edge 26a of the second underfill 26, in the direction along the X axis.

A width of the ground layer 34aC is equal to the width W1 of the ground layer 34aA. Furthermore, the width of the second underfill 26 is equal to the width W2 of the first underfill 24. For this reason, the width of the ground layer 34aC is wider than the width of the second underfill 26. The width of the ground layer 34aC is not limited to this.

As described above, the ground layer 34aC is provided over a region in which the second IC 25 and the second underfill 26 are in contact, a region in which the second screw 29 is located, and a region between the second underfill 26 and the second screw 29, in the FPC 22.

In the area A3 ranging from the second underfill 26 to the second screw 29 in the FPC 22, at least a portion of the wirings 32a extends along the direction along the X axis. The wirings 32a provided in the area A3 overlaps the support plate 27 in the direction along the X axis. The ground layer 34aC overlaps the wirings 32a provided in the area A3 in the direction along the X axis. The shape of the wirings 32a in the area A3 is not limited to the above-described shape.

In the HDD 11 of the electronic apparatus 1, if the head 17 reads data from or writes data to the disc 16, heat is generated in the first and second ICs 23 and 25. Since the thermal expansion rate of the support plate 27 is higher than the thermal expansion rate of the FPC 22, a thermal expansion greater than that of the FPC 22 occurs in the support plate 27. For this reason, the FPC 22 may be pulled out between the first screw 28 and the second screw 29.

Characteristics of the FPC 22, such as rigidity or Young's modulus, may be different among a portion to which the first IC 23 and the first underfill 24 are attached, a portion to which the second IC 25 and the second underfill 26 are attached, a portion to which the first screw 28 is attached, a portion to which the second screw 29 is attached, and a portion in which the first surface 22a is exposed. For this reason, if an external force is applied to the FPC 22 by the pulling, stress concentration may occur in the boundary of each portion in the FPC 22, in a plan view of the first surface 22a of the FPC 22, as illustrated in FIG. 3.

For example, the stress concentration may occur in a portion of the FPC 22 in which the outer edge 24a of the first underfill 24 is provided, or a portion of the FPC 22 in which the outer edge 26a of the second underfill 26 is provided. In this case, the stress concentration may also occur in the wirings 32a that are provided in those portions of the FPC 22.

As illustrated in FIG. 3, in a plan view of the first surface 22a of the FPC 22, the ground layer 34aA of the second conductive layer 34 is provided at least in the area A1 ranging from the outer edge 24a of the first underfill 24 to the outer edge 26a of the second underfill 26. In other words, the ground layer 34aA reinforces the portion of the FPC 22 on which the outer edges 24a and 26a are located, and the portion of the FPC 22 between the outer edges 24a and 26a. For this reason, the stress generated in the wirings 32a corresponding to the portion of the FPC 22 on which the outer edges 24a and 26a are located is reduced, and the damage to the wirings 32a due to the stress concentration in the wirings 32a can be suppressed. Here, the first IC 23 and the first underfill 24 are examples of a first component, and the second IC 25 and the second underfill 26 are examples of a second component.

Furthermore, as illustrated in FIG. 3, in a plan view of the first surface 22a of the FPC 22, the ground layer 34aB is provided at least in the area A2 ranging from the outer edge 24a of the first underfill 24 to the first screw 28. In other words, the ground layer 34aB reinforces the portion of the FPC 22 on which the outer edge 24a is located, and the portion of the FPC 22 between the outer edge 24a and the first screw 28. For this reason, the stress generated in the wirings 32a corresponding to the portion of the FPC 22 on which the outer edge 24a is located is reduced, and damage to the wirings 32a due to the stress concentration in the wirings 32a can be suppressed. Here, the first IC 23 and the first underfill 24 are examples of a first component, and the first screw 28 is an example of a second component.

Furthermore, as illustrated in FIG. 3, in a plan view of the first surface 22a of the FPC 22, the ground layer 34aC is provided at least in the area A3 ranging from the outer edge 26a of the second underfill 26 to the second screw 29. In other words, the ground layer 34aC reinforces the portion of the FPC 22 on which the outer edge 26a is located, and the portion of the FPC 22 between the outer edge 26a and the second screw 29. For this reason, the stress generated in the wirings 32a corresponding to the portion of the FPC 22 on which the outer edge 26a is provided is reduced, and the damage to the wirings 32a due to the stress concentration in the wirings 32a can be suppressed. Here, the second IC 25 and the second underfill 26 are examples of a first component, and the second screw 29 is an example of a second component.

As described above, the ground layers 34a reinforce boundaries and portions of the FPC 22 between the portion to which the first IC 23 and the first underfill 24 are attached, the portion to which the second IC 25 and the second underfill 26 are attached, the portion to which the first screw 28 is attached, and the portion to which the second screw 29 is attached in the FPC 22. Accordingly, the stress generated in the wirings 32a is reduced, and the damage to the wirings 32a can be suppressed.

An external force that is applied to the FPC 22 is not limited to an external force due to pulling occurring at the time of thermal expansion of the support plate 27. For example, when the head 17 swings, an external force may be applied to the FPC 22. Even when the external force is applied to the FPC 22, the stress generated in the wirings 32a can be reduced, and the damage to the wirings 32a can be suppressed, by the ground layers 34a.

In the electronic apparatus 1 according to the first embodiment, in a plan view of the first surface 22a of the FPC 22, the ground layer 34a is provided at least in the area A1 ranging from the first IC 23 and the first underfill 24 to the second IC 25 and the second underfill 26. Accordingly, the stress generated in the wirings 32a can be reduced, and the damage to the wirings 32a due to the stress concentration in the wirings 32a can be suppressed. For example, the rigidity of the FPC 22 to which the first IC 23 and the first underfill 24, and the rigidity of the FPC 22 to which the second IC 25 and the second underfill 26 are attached differ from the rigidity of the other portions in the FPC 22. Due to a difference of the characteristics, stress concentration on the wirings 32a may occur in a boundary portion between the portion to which the first IC 23 and the first underfill 24 or the second IC 25 and the second underfill 26 are attached, and the other portions, in the FPC 22. However, since the ground layer 34a is provided at least in the area A1 ranging from the first IC 23 and the first underfill 24 to the second IC 25 and the second underfill 26 in the FPC 22, the difference of the characteristics is decreased, and the stress occurring in the wirings 32a is reduced. Thus, the damage to the wirings 32a due to the stress concentration in the wirings 32a can be suppressed.

The ground layer 34a, which is a conductor, reinforces the FPC 22 as described above. Accordingly, an increase of the manufacturing cost of the electronic apparatus 1 due to providing of other members that reinforce the FPC 22, or using a harder material for the FPC 22, is suppressed. The conductor for reinforcing the FPC 22 is not limited to the ground layer 34a, and may be, for example, a signal line, a power supply layer, and an electromagnetic shield.

Since the portion in which the outer edge 24a of the first underfill 24 is positioned is a boundary portion between the portion to which the first IC 23 and the first underfill 24 are attached and the other portions in the FPC 22, the stress may be concentrated in the wirings 32a. The ground layer 34a overlaps at least a portion of the first underfill 24, whereby the ground layer 34a is provided over the portion to which the first IC 23 and the first underfill 24 are in contact, and other portions, in the FPC 22. Accordingly, a difference of characteristics, such as rigidity, between the portion to which the first IC 23 and the first underfill 24 are in contact, and other portions, is reduced more, and the stress in the wirings 32a passing through the portion at which the outer edge 24a of the first underfill 24 is positioned is reduced. Thus, the damage to the wirings 32a due to the stress concentration in the wirings 32a can be suppressed.

The stress concentration is likely to be produced in the wirings 32a in the area A1 between the first underfill 24 and the second underfill 26. However, the width W1 of the ground layer 34a is wider than the width W2 of the first underfill 24. That is, the ground layer 34a may be provided in an area wide than the area A1. Accordingly, the stress generated in the wirings 32a is reduced, and the damage to the wirings 32a due to the stress concentration in the wirings 32a can be suppressed.

The ground layer 34a reinforces the FPC 22. Accordingly, there is no need to use other members for reinforcing the FPC 22, and an increase of the manufacturing cost of the electronic apparatus 1 due to providing of other members that reinforce the FPC 22, can be suppressed. Furthermore, as the ground layer 34a is usually larger than the wirings 32a, the ground layer 34a may be used as a portion that reinforces the FPC 22.

Second Embodiment

Hereinafter, a second embodiment will be described with reference to FIG. 5 and FIG. 6. In the description of the following embodiments, the same symbols or reference numerals will be used for elements having the same functions as the configuration elements described above, and some description thereof is omitted. In addition, multiple configuration elements to which the same symbol or reference numeral is used are not limited to be same as the configuration elements described above in all functions and properties, and may have different functions and properties according to each embodiment.

Figure 5:
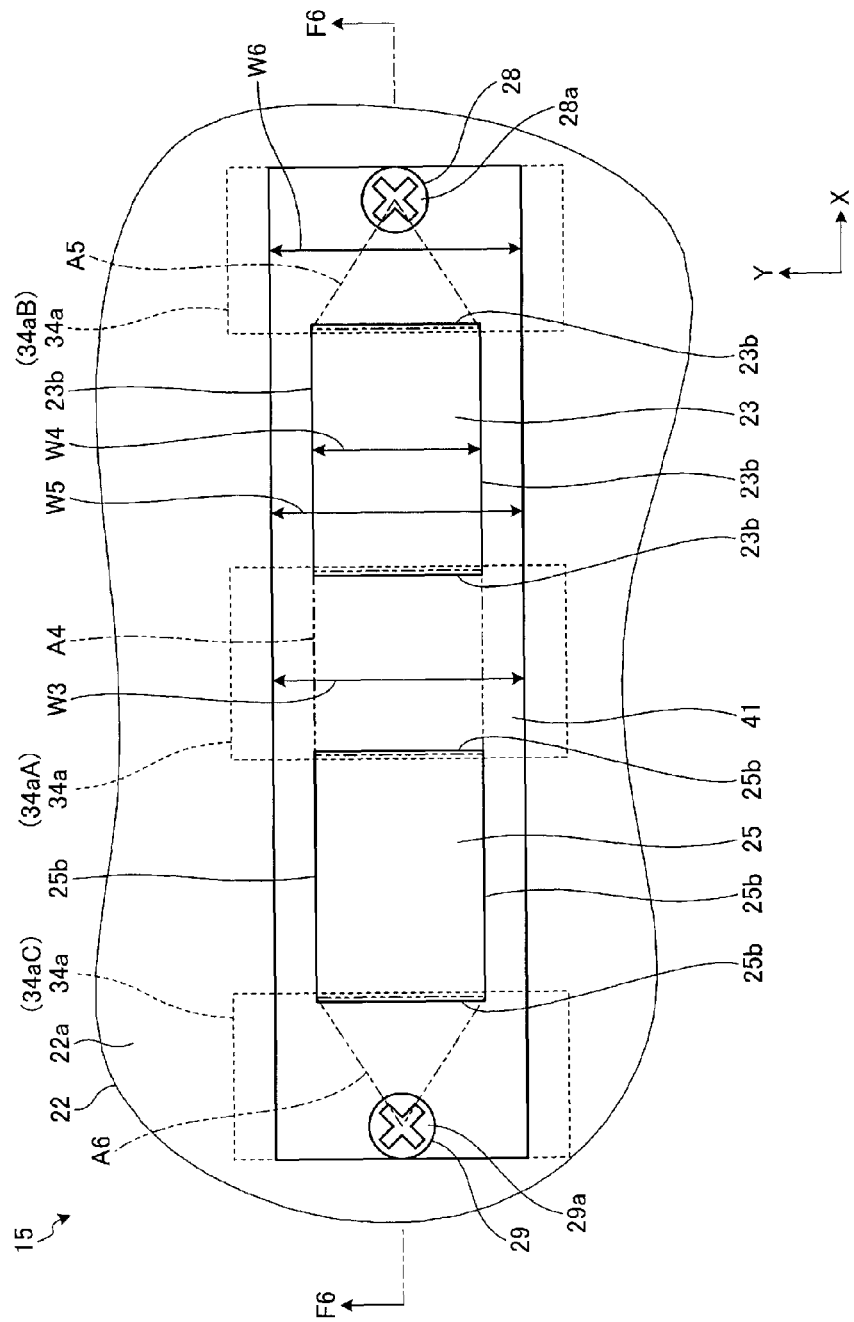
FIG. 5 is a plan view of a portion of an FPC assembly as an example of the electronic module according to a second embodiment.

FIG. 5 is a plan view of a portion of an FPC assembly according to the second embodiment. FIG. 6 is a cross-sectional view of the FPC assembly 15 according to the second embodiment, taken along a line F6-F6 of FIG. 5.

As illustrated in FIG. 5, the FPC assembly 15 according to the second embodiment has an underfill 41 instead of the first and second underfills 24 and 26. In the second embodiment, the underfill 41 is an example of a ranging portion and a first reinforcement portion, and may also be referred to as a cover portion, a retention portion, a fixing portion, an attachment portion, and a portion. Furthermore, a first IC 23 is an example of a first component, and a second IC 25 is an example of a second component. In the same manner as the first embodiment, the first IC 23, the second IC 25, a first screw 28, and a second screw 29, respectively may be a first component or a second component.

Figure 6:
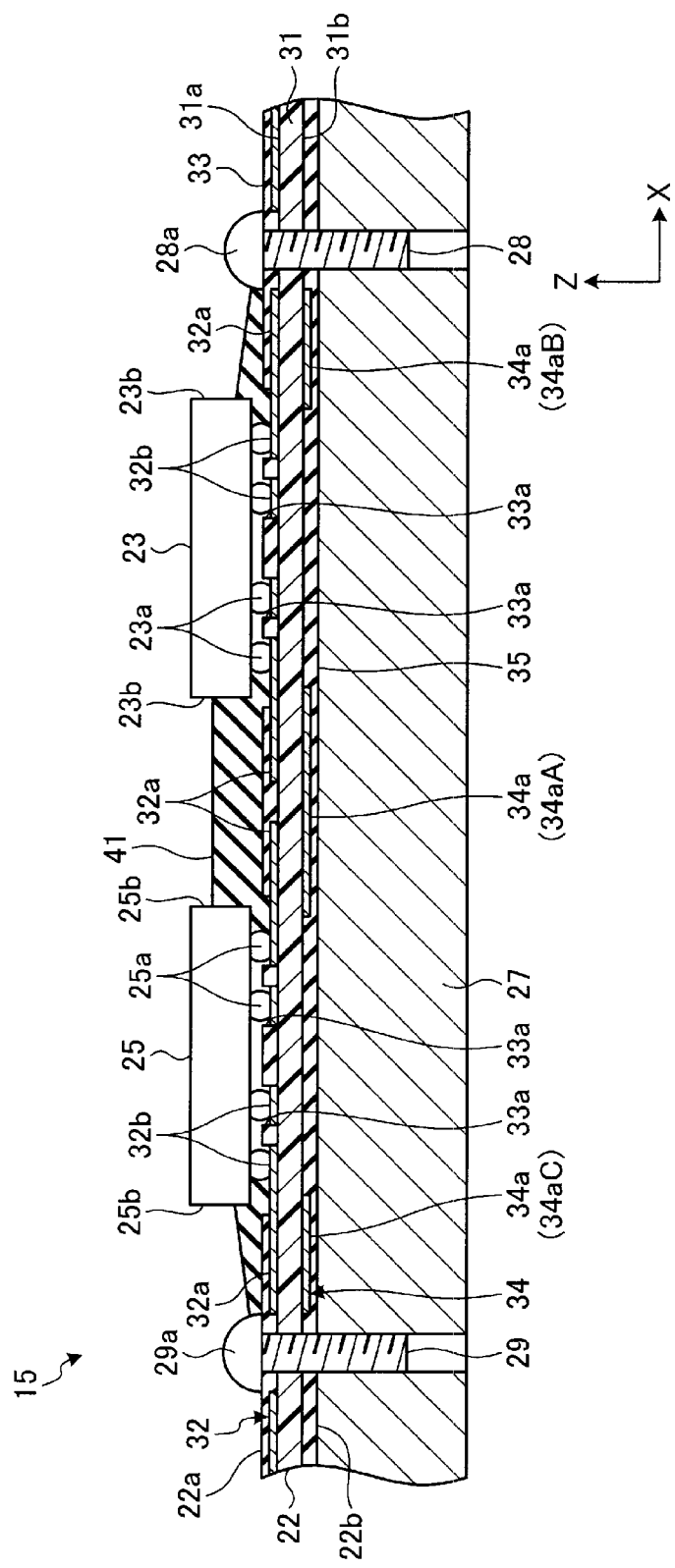
FIG. 6 is a cross-sectional view of the FPC assembly taken along a line F6-F6 of FIG. 5.

As illustrated in FIG. 6, the underfill 41 is formed of, for example, a synthetic resin, and is attached to the first IC 23, the second IC 25, and a first surface 22a of an FPC 22. In other words, the underfill 41 partially covers the first IC 23, the second IC 25, and the FPC 22. Accordingly, the underfill 41 fixes the first and second ICs 23 and 25 to the FPC 22.

The underfill 41 is disposed between the first IC 23 and the FPC 22 and between the second IC 25 and the FPC 22. As illustrated in FIG. 5, in a plan view of the first surface 22a of the FPC 22, the underfill 41 surrounds each of the first IC 23 and the second IC 25.

As illustrated in FIG. 5, in a plan view of the first surface 22a of the FPC 22, the underfill 41 is provided at least in an area A4 ranging from the first IC 23 to the second IC 25 in the FPC 22. In other words, the underfill 41 is provided in a wider area including the area A4. FIG. 5 denotes the area A4 using a two-dot chain line.

The area A4 is a portion of the FPC 22 positioned between side edges 23b and 25b of the first and second ICs 23 and 25, which face each other. For the purpose of explanation, in FIG. 5, the two-dot chain lines of the area A4 are slightly different from the side edges 23b and 25b.

The underfill 41 is disposed between the FPC 22 and each of the first and second ICs 23 and 25. That is, the underfill 41 overlaps a portion of each of the first and second ICs 23 and 25. In other words, the underfill 41 is provided over the portion in which the side edges 23b and 25b of the first and second ICs 23 and 25 are located, in a direction along an X axis.

In the present embodiment, a width W3 of the underfill 41 in a portion between the first IC 23 and the second IC 25 is wider than a width W4 of the first IC 23. In a plan view of the first surface 22a, a width W3 and the width W4 are lengths of each portion of the underfill 41 and the first IC 23, in a direction (direction along Y axis) orthogonal to a direction (direction along X axis) towards the second IC 25 from the first IC 23.

Furthermore, the width W3 of the underfill 41 in the portion between the first IC 23 and the second IC 25, is substantially equal to a width W5 of the underfill 41 in a portion that surrounds the first IC 23. The widths W3 and W5 of the underfill 41 are not limited to this relationship.

As described above, the underfill 41 is provided over a portion to which the first IC 23 is attached, a portion to which the second IC 25 is attached, and a portion positioned between the first and second ICs 23 and 25, in the FPC 22.

Furthermore, in a plan view of the first surface 22a of the FPC 22, the underfill 41 is provided at least in an area A5 ranging from the first IC 23 to the first screw 28 in the FPC 22. In other words, the underfill 41 is provided in an area wider than the area A5. FIG. 5 illustrates the area A5 using a two-dot chain line.

The area A5 is a substantially triangular portion, which is positioned between the side edge 23b of the first IC 23 and the first screw 28, in the FPC 22. For the purpose of explanation, in FIG. 5, the two-dot chain line of the area A5 is slightly different from the side edge 23b.

In the present embodiment, a width W6 of the underfill 41 in a portion between the first IC 23 and the first screw 28 is equal to the width W3 of the underfill 41 in the portion between the first and second ICs 23 and 25. That is, the width W6 of the underfill 41 in the portion between the first IC 23 and the first screw 28 is wider than the width W4 of the first IC 23.

As illustrated above, the underfill 41 is provided over the portion to which the first IC 23 is attached, a portion to which the first screw 28 is attached, and a portion positioned between the first IC 23 and the first screw 28, in the FPC 22.

Furthermore, in a plan view of the first surface 22a of the FPC 22, the underfill 41 is provided at least in an area A6 ranging from the second IC 25 to the second screw 29 in the FPC 22. In other words, the underfill 41 is provided in an area wider than the area A6. FIG. 5 illustrates the area A6 using a two-dot chain line.

The area A6 is a substantially triangular portion, which is positioned between the side edge 25b of the second IC 25 and the second screw 29, in the FPC 22. For the purpose of explanation, in FIG. 5, the two-dot chain line of the area A6 is slightly different from the side edge 25b.

In the present embodiment, a width of the underfill 41 in a portion between the second IC 25 and the second screw 29 is equal to the width W3 of the underfill 41 in the portion between the first and second ICs 23 and 25. Furthermore, the width of the second IC 25 is equal to the width W4 of the first IC 23. That is, the width of the underfill 41 in the portion between the second IC 25 and the second screw 29 is wider than the width of the second IC 25.

As illustrated above, the underfill 41 is provided over the portion to which the second IC 25 is attached, a portion to which the second screw 29 is attached, and a portion positioned between the second IC 25 and the second screw 29, in the FPC 22.

As illustrated in FIG. 5, in a plan view of the first surface 22a of the FPC 22, the underfill 41 is provided at least in the area A4 ranging from the side edge 23b of the first IC 23 to the side edge 25b of the second IC 25. In other words, the underfill 41 reinforces the portion of the FPC 22 in which the side edges 23b and 25b are provided, and the portion of the FPC 22 between the side edges 23b and 25b. For this reason, for example, the stress generated in the wirings 32a in the portion in which the side edges 23b and 25b are provided is reduced, and damage to the wirings 32a due to the stress concentration in the wirings 32a can be suppressed. Here, the first IC 23 is an example of a first component, and the second IC 25 is an example of a second component.

As illustrated in FIG. 5, in a plan view of the first surface 22a of the FPC 22, the underfill 41 is provided at least in the area A5 ranging from the side edge 23b of the first IC 23 to the first screw 28. In other words, the underfill 41 reinforces the portion of the FPC 22 in which the side edge 23b is provided, and the portion of the FPC 22 between the side edges 23b and the first screw 28. For this reason, the stress generated in the wirings 32a in the portion in which the side edge 23b is provided is reduced, and damage to the wirings 32a due to the stress concentration in the wirings 32a can be suppressed. Here, the first IC 23 is an example of a first component, and the first screw 28 is an example of a second component.

As illustrated in FIG. 5, in a plan view of the first surface 22a of the FPC 22, the underfill 41 is provided at least in the area A6 ranging from the side edge 25b of the second IC 25 to the second screw 29. In other words, the underfill 41 reinforces the portion of the FPC 22 in which the side edge 25b is provided, and the portion of the FPC 22 between the side edge 25b and the second screw 29. For this reason, the stress generated in the wirings 32a in the portion in which the side edge 25b is provided is reduced, and damage to the wirings 32a due to the stress concentration in the wirings 32a can be suppressed. Here, the second IC 25 is an example of a first component, and the second screw 29 is an example of a second component.

As described above, in the second embodiment, the underfill 41 reinforces the FPC 22. Furthermore, the ground layer 34a of the second conductive layer 34 reinforces the FPC 22, in the same manner as in the first embodiment.

In the electronic apparatus 1 according to the second embodiment, the underfill 41 that is attached to the first and second ICs 23 and 25, and the FPC 22 reinforces the FPC 22. Accordingly, stress, which may be generated in the FPC 22, between the first IC 23 and the second IC 25, becomes more uniform than a case where the underfill 41 is not provided. Thus, the stress in the wirings 32a is reduced, and damage to the wirings 32a due to the stress concentration occurring in the wirings 32a can be suppressed. There is no need to use other members for reinforcing the FPC 22, and an increase of the manufacturing cost of the electronic apparatus 1 due to providing of a member that reinforces the FPC 22 can be suppressed.

Stress is likely to be concentrated in the wirings 32a in the area A4 between the first IC 23 and the second IC 25. However, since the width W3 of the underfill 41 is wider than the width W4 of the first IC 23, the underfill 41 may be provided in the wider area including the area A4. Accordingly, the stress in the wirings 32a is reduced, and damage to the wirings 32a due to the stress concentration occurring in the wirings 32a can be suppressed.

Third Embodiment

Hereinafter, a third embodiment will be described with reference to FIG. 7. FIG. 7 is a plan view of a portion of an FPC assembly 15 according to a third embodiment. As illustrated in FIG. 7, a first IC 23 according to the third embodiment is positioned so as to be different from a second IC 25 in a direction along an X axis and a direction along a Y axis. In other words, the first and second ICs 23 and 25 are obliquely disposed in an XY plane.

For example, wirings 32a on a first conductive layer 32 extend from a portion of an FPC 22 to which the first and second ICs 23 and 25 are attached in the direction along the X axis or the direction along the Y axis. In other words, the wirings 32a extend in a direction in which side edges 23b and 25b of the first and second ICs 23 and 25 face.

In other words, as illustrated in FIG. 7, in a plan view of a first surface 22a of the FPC 22, the wirings 32a extend in a direction oblique to a direction towards a gravity center C2 of the second IC 25 from a gravity center C1 of the first IC 23. In other words, the wirings 32a extend in a direction intersecting a line L (denoted by one-dot chain line in FIG. 7) extending between the gravity center C1 and the gravity center C2, in a plan view of the first surface 22a. The direction in which the wirings 32a extend is not limited to this direction.

In a plan view of the first surface 22a, the gravity center C1 of the first IC 23 is a gravity center of a shape that is formed by the side edges 23b of the first IC 23. In other words, the gravity center C1 of the first IC 23 is a gravity center of a shape of the first IC 23 that is obtained as a projection view from a direction along a Z axis. The gravity center is geometrically obtained in assumption that the shape has a constant density.

In a plan view of the first surface 22a, the gravity center C2 of the second IC 25 is a gravity center of a shape that is formed by the side edges 23b of the second IC 25. In other words, the gravity center C2 of the second IC 25 is a gravity center of a shape of the second IC 25 that is obtained as a projection view from a direction along the Z axis. The gravity center is geometrically obtained in assumption that the shape has a constant density.

In the third embodiment, a support plate 27 includes an opening portion 27a. For example, the opening portion 27a is a notch formed on one side edge of the support plate 27. The opening portion 27a is not limited to this, and for example, may be a hole or a hollow formed in the support plate 27.

As illustrated in FIG. 7, in a plan view of the first surface 22a of the FPC 22, the wirings 32a are provided to overlap the opening portion 27a. In other words, the wirings 32a are apart from a portion of the support plate 27 at which the FPC 22 is supported thereby. For this reason, the portion of the FPC 22 in which the wirings 32a are provided may be slightly bent.

In the electronic apparatus 1 according to the third embodiment, in a plan view of the first surface 22a of the FPC 22, the wirings 32a extend in a direction oblique to a direction towards the gravity center C2 of the second IC 25 from the gravity center C1 of the first IC 23. For this reason, compared to a case where the wirings 32a extend in a direction towards the gravity center C2 of the second IC 25 from the gravity center C1 of the first IC 23, the stress occurring in the wirings 32a is reduced, and damage to the wirings 32a due to the stress concentration in the wirings 32a can be suppressed.

According to at least one embodiment described above, a reinforcing member is provided in at least an area ranging from a portion to which the first component is attached, to a portion to which the second component is attached, in the substrate. Accordingly, the stress occurring in the wirings is reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In the embodiments described above, for example, the first IC 23 and the second IC 25 are attached to the first surface 22a of the FPC 22. However, a plane to which the first component is attached may be different from a plane to which the second component is attached.

Furthermore, in the embodiments described above, the ground layer 34a is provided on the second plane 31b of the base member 31. However, a plane in which the conductor of the first reinforcement portion is provided is not limited. For example, the conductor of the first reinforcement portion may be provided in a plane in which a pad is provided, and may be provided inside a substrate having a plurality of layers.

Furthermore, in the embodiments described above, the first and second ICs 23 and 25 are mounted on the FPC 22. However, three or more ICs may be mounted on the FPC 22. Here, the ground layer 34a may be provided over the plurality of ICs.

Furthermore, in the embodiments described above, the FPC 22 is attached to the support plate 27. However, the FPC 22 may be attached to other member such as the head 17. In addition to this, a portion to which the ground layer 34a of the FPC 22 is provided may be provided so as to be apart from a portion attached to the support plate 27.

A substrate according to the embodiment will be additionally described. The substrate according to the embodiment includes a first portion to which a first component is attached, a second portion to which the second component is attached, wirings extending in a direction towards the second portion from the first portion, and a ranging portion provided at least in an area ranging from the first portion to the second portion in a plane in which at least one of the first portion and the second portion is provided in the substrate.

What is claimed is:

1. An electronic device module, comprising:
a wiring board having a first surface including first and second electrodes formed thereon and a second surface opposite to the first surface;
a supporting member attached to the second surface of the wiring board;
a first electronic unit mounted on the first surface of the wiring board and electrically connected to the first electrode; and
a second electronic unit mounted on the first surface of the wiring board and electrically connected to the second electrode, wherein
the wiring board includes a wiring extending from a first position of the first electronic unit to a second position that is closer to the second electronic unit than the first position is, and a reinforcement layer disposed between the first and second electronic units and apart from the wiring in a thickness direction of the wiring board.

2. The electronic device module according to claim 1, wherein
the wiring is disposed on the first surface of the wiring board, and the reinforcement layer is disposed on the second surface of the wiring board.

3. The electronic device module according to claim 1, wherein
the wiring overlaps the reinforcement layer in a direction perpendicular to a plane of the wiring board.

4. The electronic device module according to claim 1, wherein
the reinforcement layer is formed of a conductive material.

5. The electronic device module according to claim 4, wherein
the reinforcement layer is electrically connected to a ground potential.

6. The electronic device module according to claim 1, further comprising:
a cover layer covering the first surface of the wiring board, including a region of the first surface corresponding to the first and second electronic units and a region of the first surface on which the wiring is formed.

7. The electronic device module according to claim 6, wherein
the first and second electronic units are arranged in a first direction within a plane of the wiring board, and
a width of the reinforcement layer in a second direction within the plane of the wiring board that is perpendicular to the first direction, is greater than a width of the cover layer in the second direction.

8. The electronic device module according to claim 1, further comprising:
a fixing member fixing the wiring board to the supporting member, wherein
the wiring board includes a wiring extending from the first electronic unit towards the fixing member.

9. The electronic device module according to claim 8, wherein
the wiring board further includes a second reinforcement layer disposed in a region between the first electronic unit and the fixing member.

10. The electronic device module according to claim 1, wherein
the first and second electronic units are arranged to be offset with respect to each other along a direction in which edges of the wiring board extend, and
the wiring extends along a direction in which one of the edges of the wiring board extends.

11. The electronic device module according to claim 1, wherein
the first and second electronic units are each a semiconductor chip package including an amplifier circuit.

12. An electronic device module, comprising:
a wiring board having a first surface including a first electrode, a second electrode, and a wiring formed thereon and a second surface opposite to the first surface, the wiring extending from a first position of the first electrode to a second position that is closer to the second electrode than the first position is;
a supporting member attached to the second surface of the wiring board;
a first electronic unit mounted on the first surface of the wiring board and electrically connected to the first electrode;
a second electronic unit mounted on the first surface of the wiring board and electrically connected to the second electrode; and
a cover layer covering the first surface of the wiring board including a region corresponding to the first and second electronic units and a region in which the wiring is formed.

13. The electronic device module according to claim 12, wherein
the wiring overlaps the cover layer in a direction perpendicular to a plane of the wiring board.

14. The electronic device module according to claim 12, wherein
the cover layer is formed of an insulating material.

15. The electronic device module according to claim 12, wherein
the cover layer covers side surfaces of the first and second electronic units.

16. The electronic device module according to claim 12, wherein
the first and second electronic units are arranged in a first direction within a plane of the wiring board, and
a width of the cover layer in a second direction within the plane of the wiring board that is perpendicular to the first direction, is greater than a width of the first electronic unit in the second direction.

17. The electronic device module according to claim 12, further comprising:
a fixing member fixing the wiring board to the supporting member, wherein
the wiring board includes a wiring extending from the first electronic unit towards the fixing member, and
the cover layer covers the first surface of the wiring board further including a region between the first electronic unit and the fixing member.

18. The electronic device module according to claim 12, wherein
the first and second electronic units are arranged to be offset with respect to each other along a direction in which edges of the wiring board extend, and
the wiring extends along a direction in which one of the edges of the wiring board extends.

19. An electronic device, comprising:
a magnetic storage unit;
a head configured to write data to and read data from the magnetic storage unit; and
an electronic module configured to drive the head,
wherein the electronic module includes,
a wiring board having a first surface including first and second electrodes formed thereon and a second surface opposite to the first surface,
a supporting member attached to the second surface of the wiring board,
a first electronic unit mounted on the first surface of the wiring board and electrically connected to the first electrode, and
a second electronic unit mounted on the first surface of the wiring board and electrically connected to the second electrode, and
wherein the wiring board includes a wiring extending from a first position of the first electronic unit to a second position that is closer to the second electronic unit than the first position is, and a reinforcement layer disposed between the first and second electronic units and apart from the wiring in a thickness direction of the wiring board.

20. The electronic device according to claim 19, wherein the electronic module is attached to the head.

* * * * *